(12) United States Patent
Yoffe et al.

(10) Patent No.: US 8,913,638 B2
(45) Date of Patent: Dec. 16, 2014

(54) SEMICONDUCTOR LASER DEVICE AND CIRCUIT FOR AND METHOD OF DRIVING SAME

(75) Inventors: Gideon Yoffe, Newark, CA (US); Bardia Pezeshki, Menlo Park, CA (US); Thomas P. Schrans, Temple City, CA (US)

(73) Assignee: Kaiam Corp., Newark, CA (US)

( * ) Notice: Subject to any disclaimer, the term of this patent is extended or adjusted under 35 U.S.C. 154(b) by 0 days.

(21) Appl. No.: 13/593,142

(22) Filed: Aug. 23, 2012

(65) Prior Publication Data

US 2013/0003767 A1    Jan. 3, 2013

Related U.S. Application Data

(63) Continuation of application No. 12/748,357, filed on Mar. 26, 2010, now Pat. No. 8,265,112.

(60) Provisional application No. 61/163,748, filed on Mar. 26, 2009, provisional application No. 61/168,190, filed on Apr. 9, 2009.

(51) Int. Cl.
| | |
|---|---|
| H01S 3/00 | (2006.01) |
| H01S 5/00 | (2006.01) |
| H01S 3/097 | (2006.01) |
| H01S 3/08 | (2006.01) |
| H01S 5/0625 | (2006.01) |
| H01S 5/042 | (2006.01) |
| H01S 5/12 | (2006.01) |
| H01S 5/125 | (2006.01) |
| H01S 5/062 | (2006.01) |
| H01S 5/028 | (2006.01) |

(52) U.S. Cl.
CPC ................. H01S 5/12 (2013.01); H01S 5/0428 (2013.01); H01S 5/124 (2013.01); H01S 5/06258 (2013.01); H01S 5/125 (2013.01); H01S 5/06226 (2013.01); H01S 5/028 (2013.01)
USPC .......... 372/38.02; 372/46.01; 372/87; 372/96

(58) Field of Classification Search
USPC ................................ 372/38.02, 46.01, 87, 96
See application file for complete search history.

(56) References Cited

U.S. PATENT DOCUMENTS

| | | | |
|---|---|---|---|
| 4,720,835 A | 1/1988 | Akiba et al. | |
| 5,012,484 A | 4/1991 | Flynn et al. | |
| 5,170,402 A * | 12/1992 | Ogita et al. | 372/20 |

(Continued)

OTHER PUBLICATIONS

International Search Report on corresponding PCT application (PCT/US2010/028971) from International Searching Authority (KR) dated Oct. 21, 2010.

(Continued)

*Primary Examiner* — Armando Rodriguez
(74) *Attorney, Agent, or Firm* — Klein, O'Neill & Singh, LLP

(57) ABSTRACT

A directly driven laser includes multiple contacts, with at least one of the contacts for injecting current into the laser such that the laser reaches at least a lasing threshold and at least one of the contacts for providing a data signal to the laser. In some embodiments a differential data signal is effectively provided to a front and a rear section of the laser, while lasing threshold current is provided to a central portion of the laser.

3 Claims, 19 Drawing Sheets

(56) References Cited

U.S. PATENT DOCUMENTS

| | | | |
|---|---|---|---|
| 5,901,164 A | 5/1999 | Flanigan et al. | |
| 6,408,014 B1 | 6/2002 | Ackerman et al. | |
| 6,807,201 B1 * | 10/2004 | Nitta | 372/29.02 |
| 7,564,889 B2 * | 7/2009 | Matsui et al. | 372/96 |
| 2004/0042069 A1 | 3/2004 | Fisher | |
| 2004/0114649 A1 | 6/2004 | Asuri et al. | |
| 2004/0233947 A1 | 11/2004 | Asuri et al. | |
| 2005/0018720 A1 | 1/2005 | Kish, Jr. et al. | |
| 2005/0041699 A1 * | 2/2005 | White et al. | 372/20 |
| 2009/0058274 A1 | 3/2009 | Yokoyama et al. | |
| 2010/0260220 A1 | 10/2010 | Yoffe et al. | |

OTHER PUBLICATIONS

Written Opinion on corresponding PCT application (PCT/US2010/028971) from International Searching Authority (KR) dated Oct. 21, 2010.

* cited by examiner

SEMICONDUCTOR LASER DEVICE AND CIRCUIT FOR AND METHOD OF DRIVING SAME

CROSS REFERENCE TO RELATED APPLICATIONS

This application is a continuation of U.S. patent application Ser. No. 12/748,357, filed Mar. 26, 2010 now U.S. Pat. No. 8,265,112, which claims the benefit of the filing date of U.S. Provisional Application No. 61/163,748, filed Mar. 26, 2009, entitled "A Semiconductor Laser Device", and U.S. Provisional Application No. 61/168,190, filed Apr. 9, 2009, entitled "A Method For Directly Modulating Lasers"; the disclosures of all of which are incorporated by reference.

BACKGROUND OF THE INVENTION

Optical fiber communications has generally replaced electrical links over long distances in the past few decades. In more recent past, optical links are being used at shorter distances to connect servers to switches and for datacenters.

The advantages of fiber optics compared to electrical links are the greater bandwidth and reduced degradation of the signal with distance. At 10 Gb/s data rates, for the signal to travel more than 100-300 m in a fiber, generally single mode fiber is needed, with a typical mode size of about 8 microns. As an alternative, when distances are on the order of 100 m or less, multimode fiber and multimode vertical cavity lasers may be used. In this case the core size in the fiber is much larger at about 50 um, and alignment tolerances can be substantially looser. However, the reach is limited as different modes of the fiber travel at different speeds and it is becomes more difficult to transmit multiple wavelength simultaneously.

As bandwidth requirements increase, there is increased parallelism in both single mode and multimode fiber links. In multimode systems, additional fibers may be added to form a fiber ribbon. One great advantage of single mode fiber is that multiple wavelengths can be coupled simultaneously to get a parallel link through a single fiber. Thus a 100 Gb/s signal can be sent through a single mode fiber for many kilometers by using ten channels of 10 Gb/s each, with every lane at a different wavelength. For multimode applications, 120 Gb/s may be transmitted over 100 m using a 12 element array of vertical cavity lasers coupled to ribbon fiber with 12 fibers for transmit and 12 for receive. The parallel ribbon fibers are of course quite expensive and connectors with 24 fibers inside are complicated to make, even if they use multimode fiber with looser alignment tolerance.

Generally it is desirable to minimize the electrical power consumed and hence the heat generated by any optical link, because of the desire to pack the electronics and optics into as compact a space as possible. Therefore it is generally preferred to minimize the electrical drive current for each laser. Vertical cavity surface-emitting lasers (VCSELs), with their very small active area, have a threshold current for lasing typically below 5 milliamps, and can operate at a bias current below 20 milliamps, with a peak-peak modulation current of 10 milliamps or less. These lasers, however, have serious drawbacks in multiple wavelength links. Their lasing wavelengths generally scale linearly with the thickness of the semiconductor layers that make up the laser cavity, and generally cannot be controlled to within the accuracy required in multiple wavelength systems, which is typically 0.1% or better. Also their small area and circular shape give them a high thermal resistance, and their output optical power is generally limited to below 1 milliwatt, especially at high temperature. The optical elements that combine optical signals at different wavelengths into a single fiber inevitably introduce optical loss. In order to ensure that sufficient optical power is transmitted for reliable data transfer, there is generally a minimum output power requirement for the laser, typically in excess of 1 milliwatt.

Greater optical power output and wavelength control can often be provided by edge-emitting mode-controlled semiconductor lasers such as distributed feedback (DFB) lasers. In these lasers, the wavelength is controlled by the periodicity of an etched grating, which is controlled very precisely by lithography, either optical or electron beam. The narrow stripe geometry of DFB lasers is very suitable for heat dissipation, so these lasers can be driven at high current in order to achieve high optical power output. The disadvantage of conventional DFB lasers is they generally use a high electrical current drive relative to VCSELs. The threshold current for lasing of DFBs is typically around 10 milliamps at 25° C. and 25 to 40 milliamps at 85° C.

Unfortunately it is difficult to achieve very low threshold current for a DFB laser, for example by reducing the length of the laser, because the required optical gain per unit length increases beyond what is easily achievable. Another problem with shorter DFB lasers of for example 110 μm length is that it is difficult to cleave devices shorter than about 200 μm.

Regarding possible use of Distributed Bragg Reflector (DBR) laser designs, the disadvantages of this structure relate to the longitudinal optical mode control, since there is no grating in the active region. This type of laser has a certain yield for single-wavelength operation, which means that screening is required. A bigger problem is the tendency to "hop" from one wavelength to another as the drive current is changed. This tendency means that there would be a narrow range of acceptable bias current for any individual laser, so device yield would be quite low and testing and calibration would be time consuming.

The electrical drive circuitry that supplies current to the laser diode is another cause of undesired power dissipation, because of its complexity and the general requirement to provide separate current paths for the direct current bias and the radio-frequency (RF) data signal. The simplest method to modulate a DML for the transmission of binary data is to turn the laser on for transmission of a 1 bit and to turn the laser off for the transmission of a 0 bit. This method only works well for relatively low bit rates (up to Mb/s) as the turn on delay of the laser and associated noise and laser response (laser relaxation oscillation) result in significant degradation of the transmitted signal for bit rates exceeding several Mb/s. Therefore at higher bit rates it is necessary to keep the laser above its lasing threshold condition at all times, and hence the laser is modulated from a low lasing power $P_0$, achieved at laser current $I_0$, for a 0 bit, to a high lasing power $P_1$, achieved at a laser current $I_1$, for a 1 bit, as illustrated in FIG. 1. Laser drivers for DMLs at bit rates exceeding several Mb/s typically consist of a current steering output stage and therefore can drive either zero current for a 0 bit or a nonzero modulation current for a 1 bit. As a result the nonzero current $I_0$ for a 0 bit has to be provided through a different path to the laser. This DC path is typically implemented using inductors to provide high impedance as to block the RF modulation from leaking out through this path, yet be low impedance at DC due to the limited DC supply voltage available. For optical links the RF content of the data covers a wide frequency spectrum resulting in an inductive path that typically consists of several low cost inductors and resistors, or costly high quality inductors. In addition the voltage level for the laser typically does not match the voltage levels for the output stage of the laser driver and as a result the laser driver and laser are AC coupled using a capacitor, and additional inductors are placed on the laser driver side of the AC coupling capacitor to provide the correct DC voltage level on the driver output. For 10 Gb/s this can lead to 10 to 25 passive components in the circuit connecting the laser driver output to the laser as shown in FIG. 2 which shows a directly modulated laser diode 21 driven with a data signal provided by a driver 23, with passive components 25, for example as mentioned above. Some of those components can be of significant size to provide high impedance at relatively low frequencies. This typical bias circuit, usually referred to as a bias tee, is not only large in size but also inefficient in terms of electrical power dissipation, as the DC component of the LDD output stage is not used in the LD due to the DC blocking of the coupling capacitors. In some implementations the differential configuration shown in FIG. 2 is simplified to a single ended configuration, resulting in a lower number of passive components. For applications with multiple 10 Gb/s lanes in the same module, however, a differential configuration would be preferred to reduce link performance degradation caused by electrical crosstalk between the lanes. Variations on this, which add a laser driver final stage co-located in the laser package, use relatively large components inside the laser package, which is undesirable as well.

BRIEF SUMMARY OF THE INVENTION

In one aspect the invention provides a distributed feedback (DFB) laser, comprising: a waveguide including an active region, with a grating in or about the waveguide, the waveguide having a longitudinal length in a direction between a front facet and a rear facet, the waveguide being generally about layers forming a p-n junction, and an anode electrical contact and a cathode electrical contact; with at least one of the anode electrical contact and the cathode electrical contact having a longitudinal length in the direction between the front facet and the rear facet less than the longitudinal length of the active region.

In another aspect the invention provides a method of operating a laser, comprising: providing a data current signal into a first longitudinal portion of the laser and not providing the data current signal into a second longitudinal portion of the laser; and providing a bias current signal into the second longitudinal portion of the laser and not providing the bias current signal into the first longitudinal portion of the laser.

In another aspect the invention provides a method of operating a laser, comprising: providing a differential signal to a pair of gain stages within a package containing the laser, the differential signal providing a data signal, the pair of gain stages providing a signal to a front portion of the laser and/or a rear portion of the laser depending on state of the differential signal; and providing a bias signal to a central portion of the laser.

In another aspect the invention provides a laser and drive circuitry, comprising: a laser with a first electrical contact and a second electrical contact, each for provision of current signals to the laser, and a contact coupled to ground; a dc current source coupled to the first electrical contact; and a data signal driver coupled to the second electrical contact.

Some aspects of the invention provide a directly modulated distributed feedback laser where there are at least two sections to the laser and where modulated current injection is confined to the section with the highest optical mode density.

In some such aspects there is a phase shift in the grating in the cavity, the two facets of the laser cavity are anti-reflection coated, and modulated current injection is limited to the section of the laser around the phase shift region and towards the front of the laser.

In some such aspects the other section of the laser is also electrically pumped, but only with a DC current to maintain transparency. The gain material is rendered non-absorbing outside of the pumping region by being physically removed through an etch and replaced by a higher bandgap semiconductor material or by being composed of material of higher bandgap deposited through selective area growth or by being disordered and diffused into a higher bandgap state through a combination of an implant and an anneal.

In some such aspects there is no phase shift in grating providing feedback in the cavity and where the rear of the laser is coated with a high reflectivity coating and the front is coated with an anti-reflectivity material and where the rear of the laser is electrically pumped with the modulation signal and the front region is either unpumped or made optically transparent with a DC current.

In some such aspects there are three sections to the laser and where there is a phase shift in the cavity, where the optical mode peaks. Only the more central section that contains the phase shift region is pumped with a modulation current and where the two other sections in the very front and the rear of the laser are left either unpumped, or fed with a DC current to render them transparent.

Some aspects of the invention provide a laser diode supplying sufficient optical power for multiple-wavelength optical transmission systems, with excellent wavelength control, while operating at a low enough electrical drive current for it to be driven by inexpensive low-power electronics.

In aspects of the invention a distributed feedback laser is provided, in which the electrical drive current is applied to a limited section of the device. In some embodiments electrical drive current is applied to a limited section of the device for the purpose of lowering the electrical drive current. In some embodiments the remainder of the device either has no electrical current drive or a continuous current drive, and provides optical feedback.

One aspect of the invention provides a laser diode and associated bias and modulation circuit that can be connected to the laser diode driver with a significantly reduced number of passive components. In another aspect the invention provides a directly modulated laser in which the DC bias is applied to one section of the laser and the high-speed modulation signal is applied to a different section of the laser, which in some aspects eliminates costly and bulky bias tees. Some of the embodiments of the invention also achieve a reduction in electrical power dissipation by eliminating the AC coupling between the laser diode driver and the laser diode.

In some aspects of the invention, a multi-section directly modulated laser (DFB or FP) is provided, in which the DC electrical drive current is applied to one or more sections of the device, for the purpose of biasing the laser above its lasing threshold and avoid signal degradation from laser turn on. The RF electrical modulation current containing the data is applied to one or more different sections without any DC prebias. The RF electrical modulation current on those sections modulates the laser optical output power without any turn on related signal degradation (for example jitter or ringing) as the laser is biased above threshold by means of the DC electrical drive current in the first section. In some embodiments this method of directly modulating a laser eliminates the need of a large number of passive electrical components in the circuit connecting the laser diode driver to the laser diode. In embodiments where AC coupling is eliminated, for example, a reduction in electrical power dissipation is obtained as well. For certain embodiments of the invention, the modulation current results in a larger optical modulation amplitude out of one of the laser facets, compared to applying the same total current modulation to a single section device, at the expense of smaller optical modulation amplitude out of the other facet. This leads to an additional reduction in electrical power dissipation as for the same optical modulation amplitude less electrical modulation current is needed These and other aspects of the invention are more fully comprehended upon review of this disclosure.

BRIEF DESCRIPTION OF THE DRAWINGS

FIG. 3a illustrates a cross-section of the DFB laser of FIG. 3;

FIG. 10a is a chart of optical intensity versus position in the cavity of the laser of FIG. 10;

DETAILED DESCRIPTION

Figure 3:
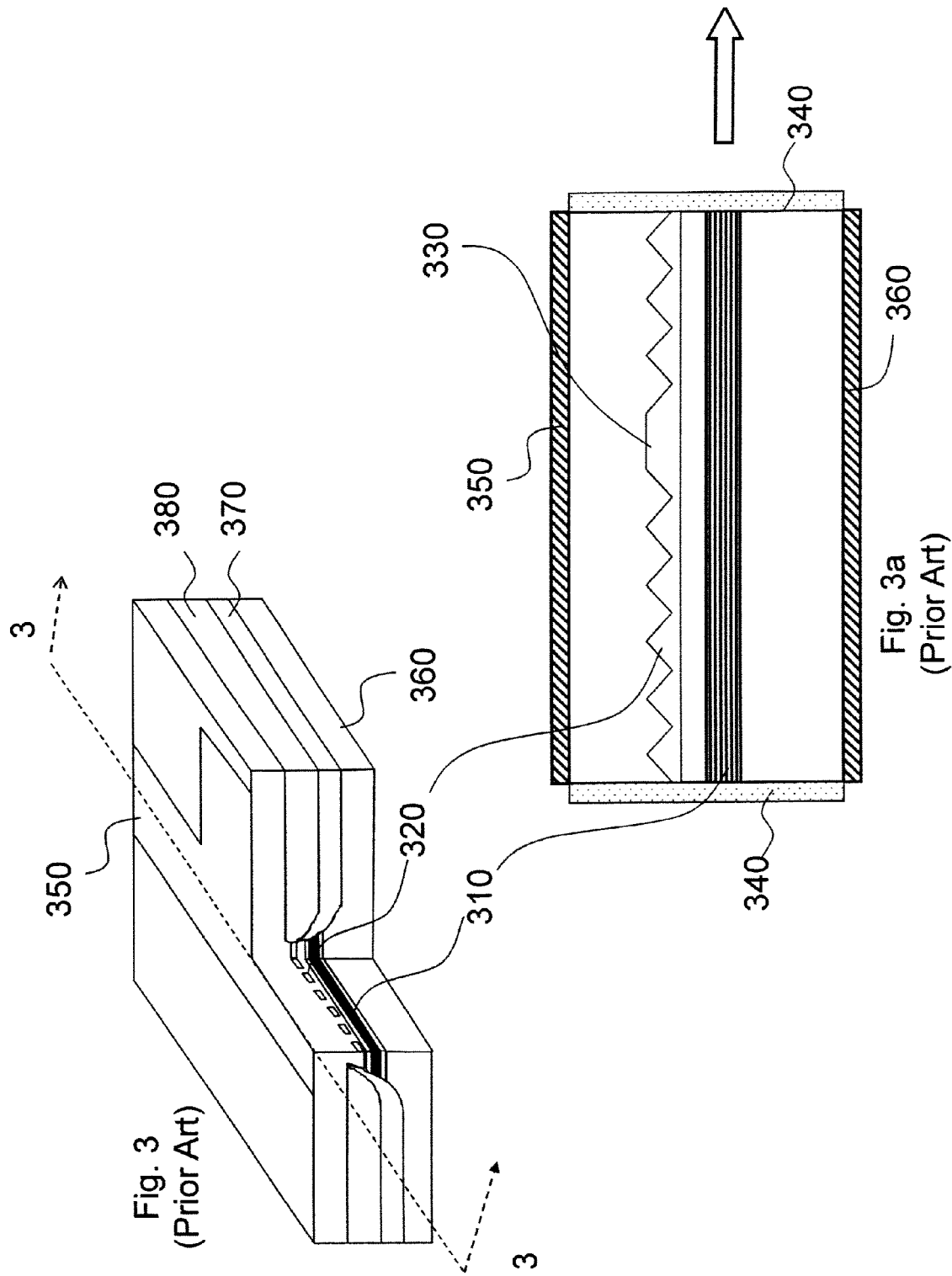
FIG. 3 illustrates a DFB laser with a partial cutaway section.

Distributed feedback (DFB) semiconductor lasers have been the preferred optical sources for fiber-optic transmission systems for several years. A typical DFB laser is illustrated in FIG. 3, while a cross-section along the dotted line is shown in FIG. 3a. Features of the illustrated DFB laser are as follows:

The DFB laser contains a waveguide structure 310 whose core provides optical gain under current injection. Typically the gain material contains one or more quantum wells, semiconductor layers with thickness between 2 nm and 20 nm. Typically the length of the waveguide is at least 0.2 mm, although some examples are shorter. See, e.g., K. Nakahara et al., "40-Gb/s Direct Modulation With High Extinction Ratio Operation of 1.3-μm InGaAlAs Multiquantum Well Ridge Waveguide Distributed Feedback Lasers", IEEE Photonics Technology Letters Vol. 19, No. 19, Oct. 1, 2007, pp. 1436-1438, incorporated by reference herein. Typically the end facets are formed by cleaving along crystal planes, although some lasers have facets formed by etching.

A grating structure 320, running along the waveguide is etched into one or more of the layers comprising the waveguide. This grating provides wavelength-selective optical feedback. In some cases one or more phase shifts 330 are introduced into the grating structure in order to enhance the wavelength selectivity. In the case that a phase shift is incorporated, and as illustrated in FIG. 3a, the facets are generally coated with anti-reflection coatings 340. In the case that the grating contains no phase shift, the rear facet is typically coated for high reflectivity, while the front facet is coated for low reflectivity. The front facet of the laser is generally understood in the art to be the facet from which useful light is generally emitted, although it is also generally understood in the art that light emitted from the rear facet may also be utilized, for example for monitoring purposes.

The semiconductor structure generally forms a p-n diode, with the junction located in or close to the gain region. An anode electrical contact 350 (also referred to as a top electrical contact herein, and as shown in FIG. 3) is usually applied to the p region, while a cathode electrical contact 360 (also referred to as a bottom electrical contact herein, and as shown in FIG. 3) is made to the typically n-doped substrate region.

The DFB in FIG. 3 is a buried heterostructure device. In contrast to a simpler ridge laser, where the lateral confinement is obtained by simply etching a ridge into the laser (which may instead, for example, be done and used), in a buried heterostructure, the ridge or mesa is regrown with a blocking junction, thus surrounding the optical mode with semiconductor on all sides. In FIG. 3a, the laser includes layers 370 and 380, which are the p and n blocking junctions respectively.

Figure 4:
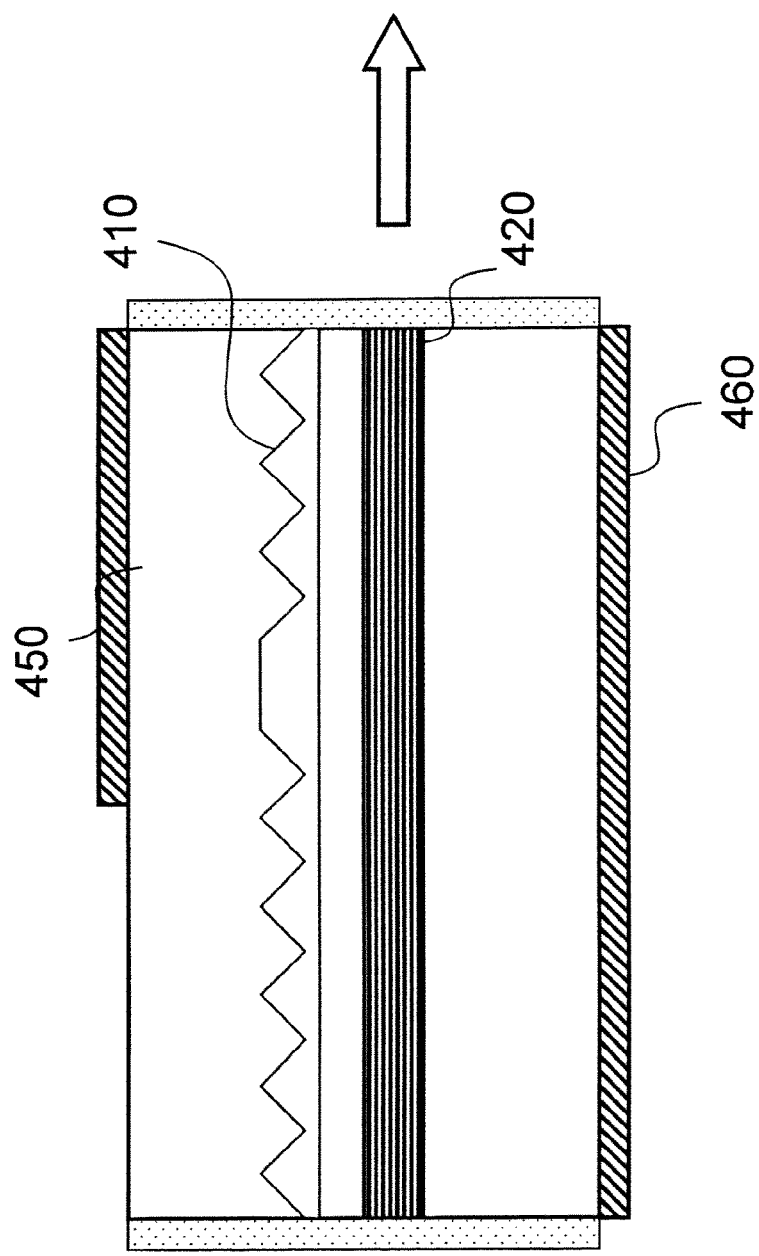
FIG. 4 illustrates a cross-section of a DFB laser in accordance with aspects of the invention.

An embodiment of a cross-section of a DFB laser in accordance with aspects of the invention is illustrated in FIG. 4. FIG. 4 shows a DFB laser, with a phase-shifted grating 410, a waveguide 420, a top electrical contact 450, and a bottom electrical contact 460. As illustrated in FIG. 4 the front section is the front half of the laser and the rear section is the rear half of the laser. As one of skill in the art would understand, however, the front section, or alternatively the rear section, is longer or shorter in various embodiments. The top electrical contact 450 is placed only on a front section of the laser, thereby restricting electrical current injection to this region of the laser. Of course, in various embodiments isolation implants or other structures may be used to restrict injection of current to particular regions of the laser. A rear section of the laser provides optical feedback, since the grating is present, but the rear section provides no optical gain because there is no current injection in the rear section. If quantum well material is kept in the waveguide in the rear section, there will be some optical absorption in this region. At high optical intensities, the material will bleach out and only present a minor inefficiency in the laser.

An advantage of this arrangement of the electrical contacts, compared to a device the same length but with the top electrical contact extending the entire length of the device, is that the electrical current to generate electrical gain is reduced. With appropriate selection of the so-called "coupling strength", a measure of the optical feedback per unit length provided by the grating, the threshold current and operating current can be reduced compared to conventional DFB device.

An alternative approach is to make a conventional DFB laser of a shorter cavity length, corresponding to the length of the top electrical contact in the arrangement illustrated in FIG. 4, with a higher grating coupling strength in order to provide the required optical feedback in a shorter cavity length. There are several advantages to taking an approach described herein, some of which will be applicable depending on the proposed application and on the established technology at the place of design or manufacture.

In many embodiments a desired overall optical feedback, characterized by the product of the grating coupling strength and the length of the grating, can be achieved with a lower coupling strength. There are practical technological limits to the coupling strength, which depends on (i) the depth and shape of the grating teeth, (ii) the difference between the refractive indices of the material in which the grating is etched and the material that fills in between the teeth, and (iii) how much of the optical waveguide mode is confined within the grating structure. For very short laser cavities it may be impossible to achieve a desired coupling strength when the grating is required to be the same length as the gain region.

Figures 5, 5A:
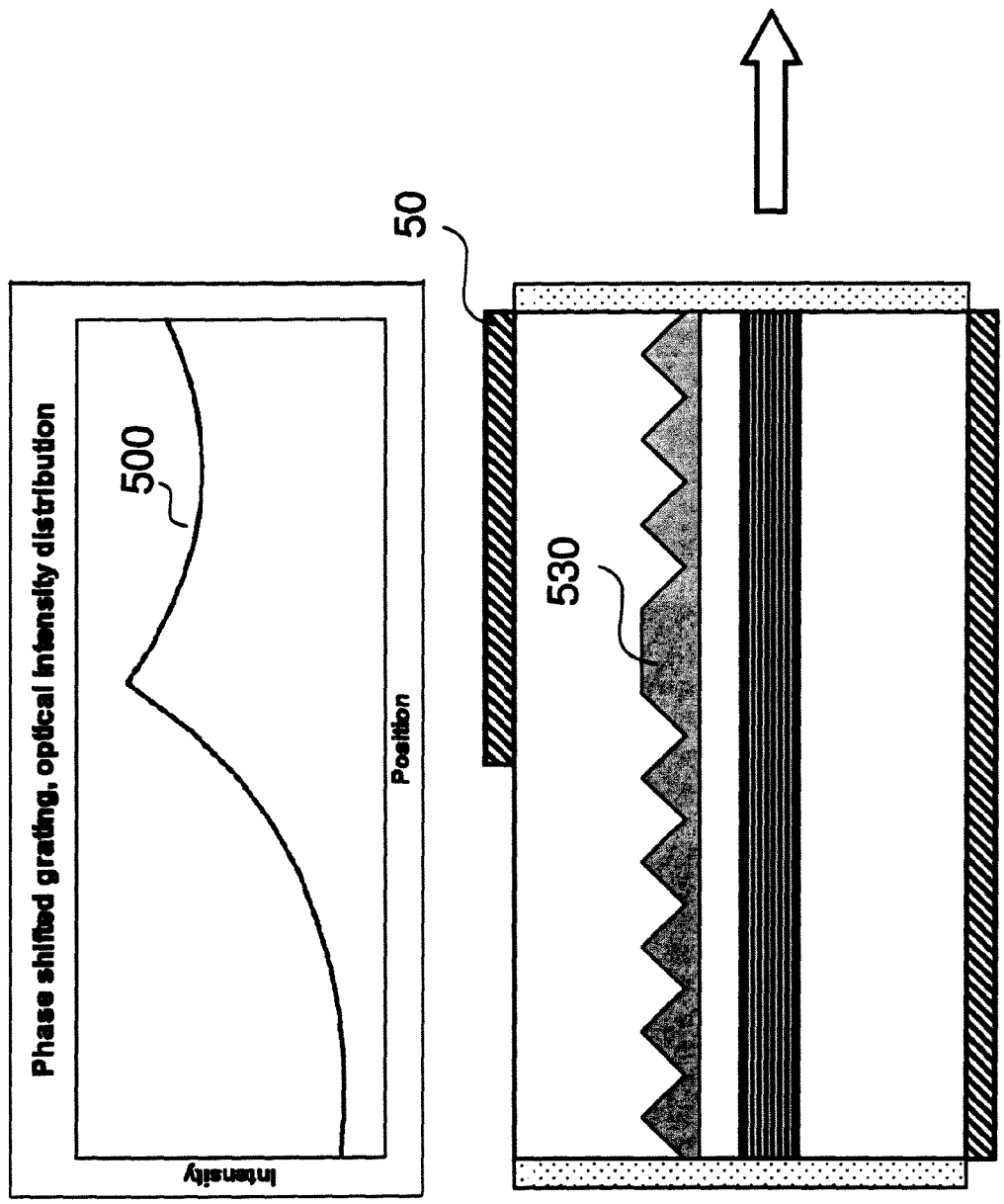
FIG. 5 further illustrates the cross-section of a DFB laser of FIG. 4
FIG. 5a is a chart of optical intensity versus position in the cavity of the laser of FIG. 5.

Another advantage is that the optical gain is provided in the region where the optical intensity is highest. FIG. 5A shows a curve 500 of the intensity of the light in a laser cavity, for example the laser of FIG. 5, which as illustrated corresponds to the laser of FIG. 4. It is higher in the front of the laser than in the back (or rear) of the laser, and has a maximum at the position of a phase shift 530 in the grating in the laser. Generally the longitudinal design will be optimized for higher output power at the front facet than at the rear facet, for example by locating the phase shift towards the front of the laser. Optical gain is generally used most efficiently when it occurs in regions where the optical intensity is high. This principle was investigated with respect to VCSELs, in which the length of the optical cavity is only one or a few optical wavelengths. The gain material is placed only at the peaks of the optical standing wave by careful design of the vertical structure of a VCSEL. For a VCSEL this arrangement has been shown to increase the effective optical gain, for example as described in S. W. Corzine et al., "Design of Fabry-Perot surface-emitting lasers with a periodic gain structure", IEEE J. Quantum Electronics vol. 25, no. 6, June 1989, p. 1513-1524, the disclosure of which is incorporated by reference herein. In accordance with aspects of the invention, the location of the optical gain along the cavity is determined by the electrical contacts rather than the vertical material structure. The optical intensity is quite low towards the rear facet of a phase-shifted DFB laser, so any current injected there is not used efficiently. Thus one can obtain maximum efficiency by injecting the current only in the front section, for example trough use of a top electrical contact that is on a front portion (front half as illustrated in FIG. 5*a*) of the laser of the DFB where the optical mode is the strongest.

The modulation speed of the laser also depends on the size of the lasing cavity. The longer the laser and the photon residence time, the slower the modulation frequency. Thus it is preferred in laser designs such as shown in FIG. 5 to use the strongest grating strength possible to minimize the amount of light penetrating the back grating. There is no trade-off between low modulation current and high speed operation, as both generally require a short cavity with high grating strengths.

To illustrate aspects of the invention, simulations have been performed. A detailed longitudinal model of a DFB laser cavity has been developed. The etched grating is analyzed using the coupled-mode equations, and the interacting densities of photons and electrons are calculated using rate equations. The longitudinal cavity is divided into multiple short sections, in each of which the photon and electron densities, grating strength, temperature, etc., are kept constant, but can vary from section to section. The local optical gain, absorption and refractive index are modeled parametrically as functions of electron density and temperature, which is estimated based on separately calculated or measured thermal resistance. An iterative approach, based on multiplication of characteristic matrices for each section, is used to solve self-consistently for the electron density, optical power, temperature, effective refractive index and optical gain for each section at a given current.

Figure 6:
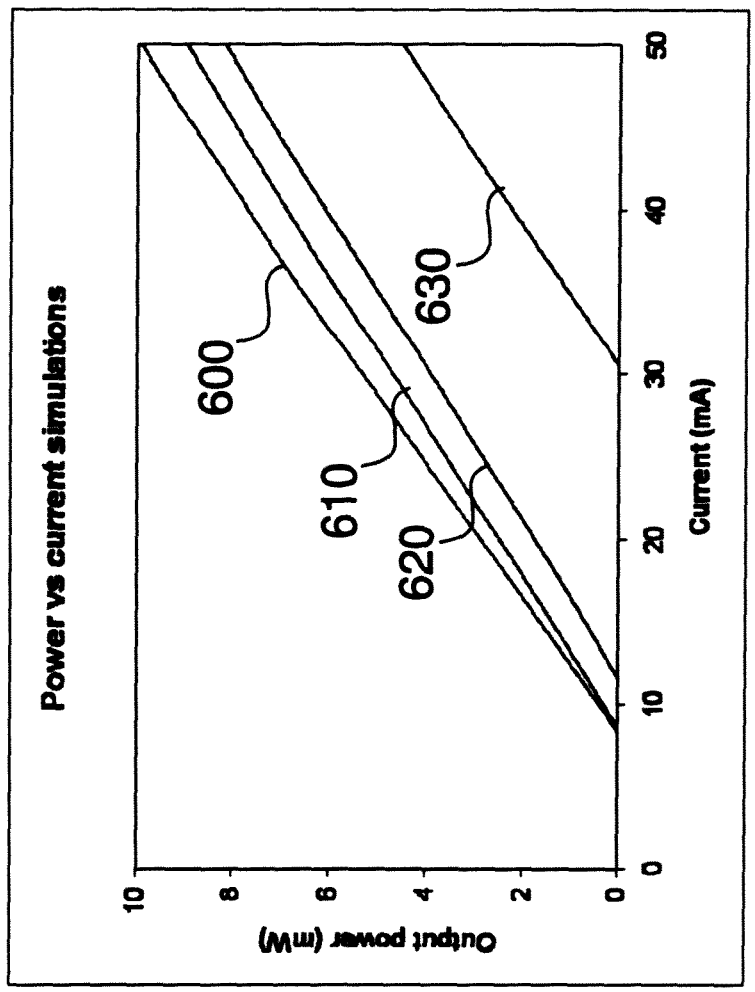
FIG. 6 is a chart of simulated output power versus drive current.

Simulations were performed for a DFB laser 250 microns long, with a grating whose coupling strength is 100 inverse cm, with a phase shift placed 100 microns from the front facet. This grating strength is regarded as quite high using standard materials and technologies. Four separate cases are considered, and simulated curves of power vs current are shown in FIG. 6: (i) current is applied over the entire length of the structure—shown as a first curve 620; (ii) current is applied over the front 150 microns of the structure, with no current applied to the rear 100 microns, where there is some optical absorption rather than gain—shown as a second curve 600; (iii) the device is shortened to 150 microns long, with the same grating strength—shown as a third curve (430); (iv) the device is 150 microns long, with the grating strength increased to 190 inverse cm (in order to obtain the same threshold current as in case (ii))—shown as a fourth curve 610. A comparison of the different cases shows that case (ii), with current injection over only part of the cavity, gives significantly lower threshold current than cases (i) and (iii). Comparison with case (iv), the shorter DFB laser with a stronger grating that has a similar threshold current, shows that case (ii) offers higher output efficiency. A further advantage of case (ii) over case (iv) is that case (iv) requires a much higher grating strength, most likely a deeper etch, pushing the technological boundaries and possibly introducing additional losses due to light scattering that are not considered in this model.

There are many modifications that can be made that can further enhance performance of a DFB laser.

In some embodiments, the physical period of the grating may differ between the two sections, in order to achieve the desired matching of the optical characteristics while taking into account different temperatures and electrical carrier densities in the two sections.

Figure 7:
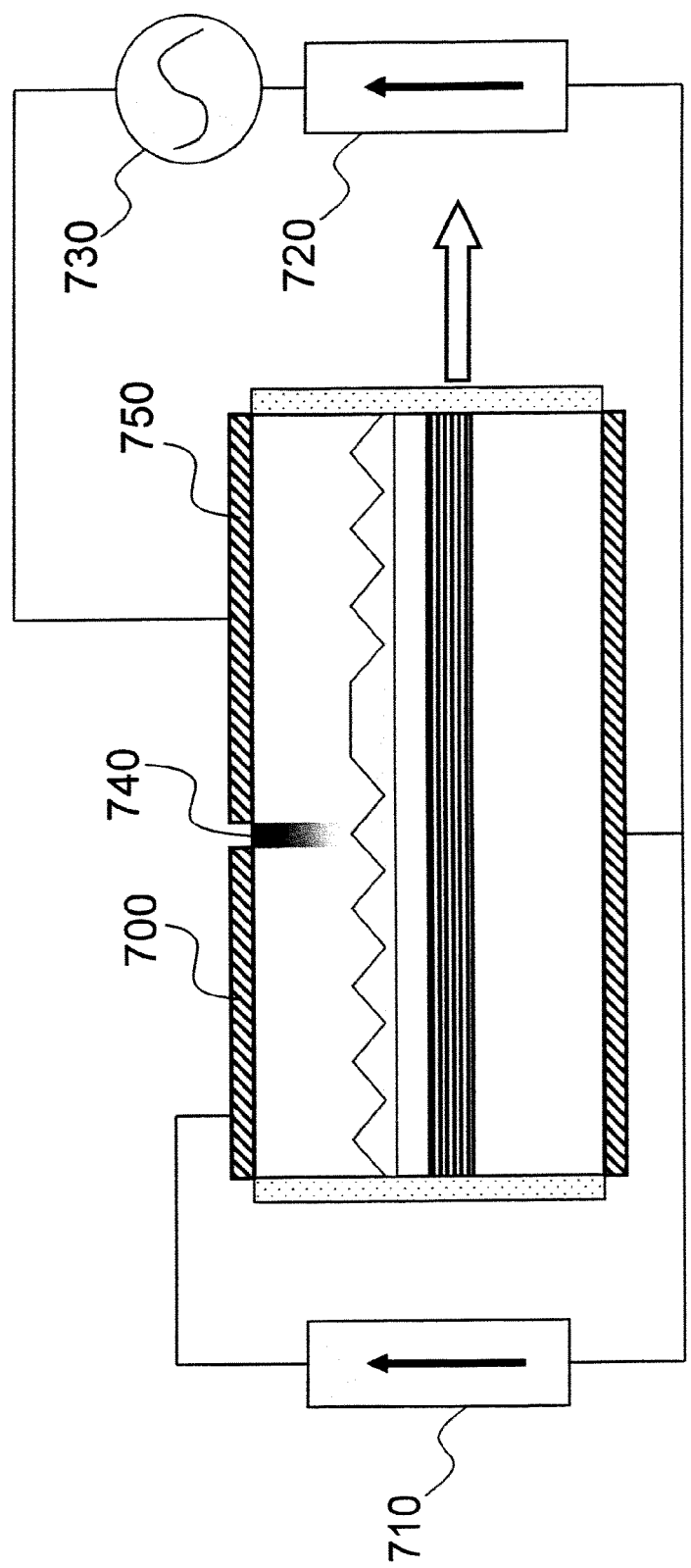
FIG. 7 is a semi-schematic and semi-cross section illustration of a laser and drive circuitry in accordance with aspects of the invention.

FIG. 7 shows a similar DFB laser to that in FIG. 4, but the laser of FIG. 7 contains a separate contact 700 to the rear section of the laser in addition to the main laser anode contact 750. The laser is fed current with two separate electrical lines. The electrical line feeding current the rear of the laser, where the optical mode is weakest, is connected to a DC current source 710. This current would be a low steady value meant to keep the rear of the laser transparent. The main laser anode 750 is fed with a conventional electrical input of a combination of a DC current 720 and an AC modulation current 730 that contains the signal that is to be transmitted. Thus only one contact where the optical mode is highest, the front contact 750, is connected to the modulation current. In this way the optical loss in the unpumped section can be substantially eliminated by a small DC current, while the low signal drive current is well within the reach of inexpensive electronics.

The two sections, the front section and the rear section, preferably are electrically isolated. This can be done by etching the top p-cladding, for example to form a trench partially into the laser—deep enough to substantially increase the electrical resistance between the two sections, but not so deep as to induce high optical loss, or alternatively to implant the region between the two sections with protons or helium to increase resistance. In FIG. 7, an isolation implant 740 is shown between the two electrical contacts.

Figure 8:
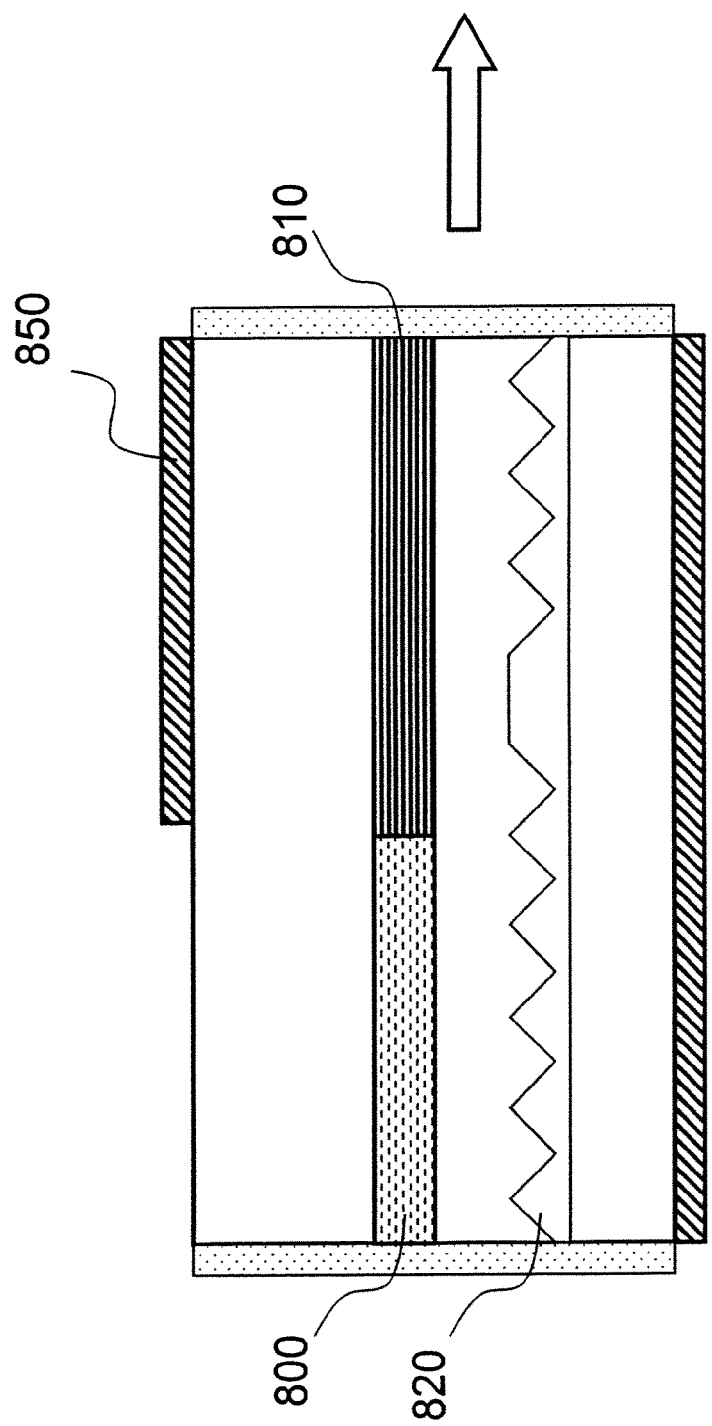
FIG. 8 illustrates a cross-section of a further DFB laser in accordance with aspects of the invention.

FIG. 8 shows a similar DFB laser to that in FIG. 4, but in this case the gain region 810 has been etched away in the region without a contact and replaced by a non-absorbing waveguide region 800. Again, the loss is substantially eliminated from the rear section, and in this case no separate DC current is required. A slight disadvantage of this approach is the higher process complexity, for example etching and regrowing a passive waveguide within the laser and also possibly additional loss in the transition between the two waveguides.

Another technique to eliminate the active region 810 and the associated loss from the rear of the laser is by using selective area growth. In this technique an oxide mask with windows is used on the wafer during the growth process. The rate of growth increases in the regions where there is a large area of oxide, and the quantum wells become thicker as well as change in composition. One side of the laser can therefore be made transparent with a wider bandgap by including oxide regions around the active section.

A third technique to increase the bandgap on the rear of the laser and make it transparent is with the use of an implant coupled with an anneal. In impurity induced disordering methods, the side of the laser to be made transparent is implanted with a material that causes vacancies. During an anneal these vacancies migrate and cause the quantum wells to wash out thereby increasing the bandgap.

In many bandgap changing techniques, such as etch and regrow, or selective area growth, it is advantageous to put the diffraction grating below the active layer. In this way, the planarity of the grating layer is not disturbed by the etch and regrowth process of the active layer. Thus in FIG. 8, the grating layer 820 is shown below the active region 800.

Figure 9:
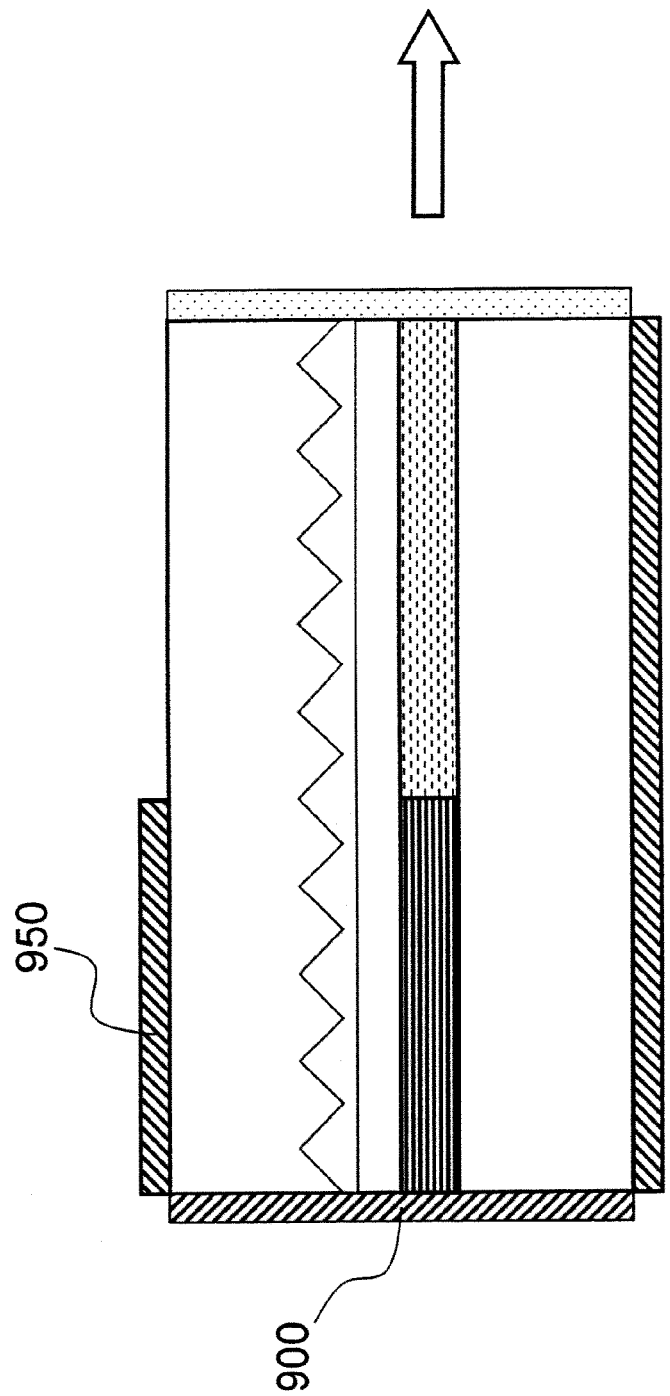
FIG. 9 illustrates a cross-section of a further DFB laser in accordance with aspects of the invention.

FIG. 9 shows a similar DFB laser to that in FIG. 8, but in this case the grating is uniform with no phase shift section, and the rear facet has a high-reflectivity optical coating 900. In this case the current may be applied to the rear section of the laser, since the optical intensity is strongest there. The same techniques previously discussed can be applied to make the active layer transparent on the side of the laser with the reduced optical field, and obtain the advantage of reduced operating current and higher speed modulation.

Figure 10:
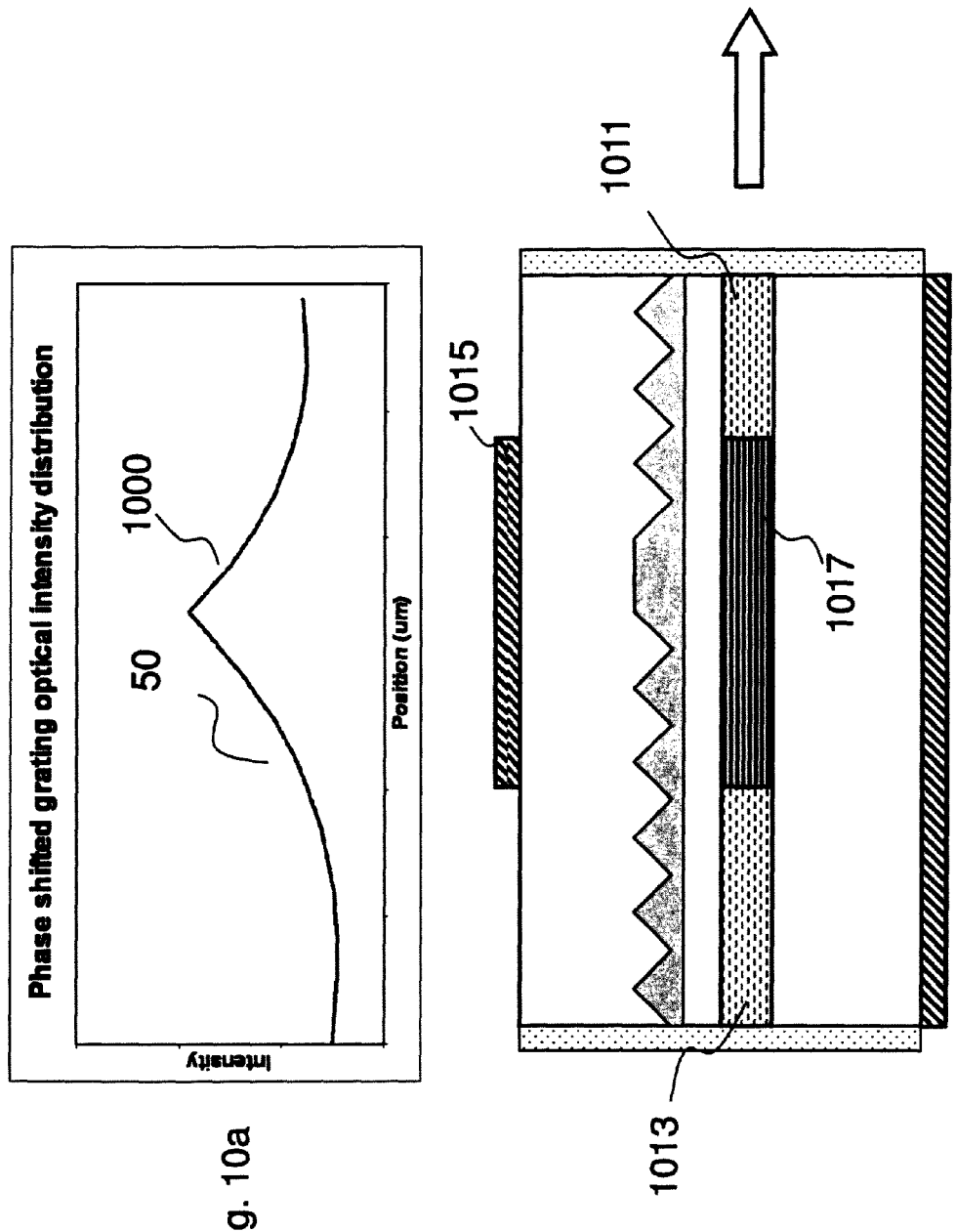
FIG. 10 illustrates a cross-section of a further DFB laser in accordance with aspects of the invention.

FIG. 10 shows a similar DFB laser to that in FIG. 8, but the DFB laser of FIG. 10 contains two non-absorbing regions 1011, 1013 in the waveguide at the front and rear of the laser, with a top electrical contact 1015 over a central active region 1017 of the waveguide. This arrangement takes further advantage of the optical intensity distribution along the laser cavity (as shown in FIG. 10a), placing the gain only where the intensity is highest. In addition, in some embodiments the coupling coefficient of the grating is modified compared to the case illustrated in FIG. 3a, in order to enhance the peaking of the optical intensity around the grating phase shift position and to lower the optical intensity near the front facet.

Figure 1:
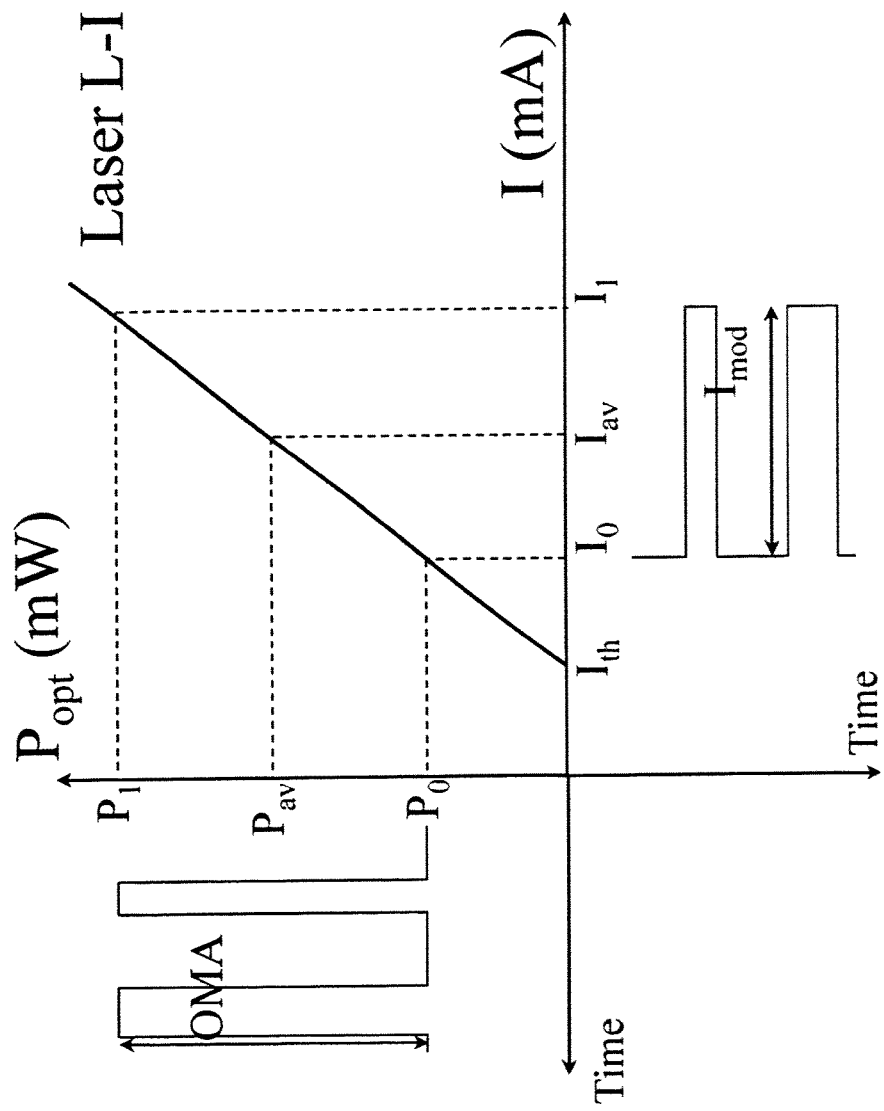
FIG. 1 is a chart showing laser optical power versus drive current.
Figure 2:
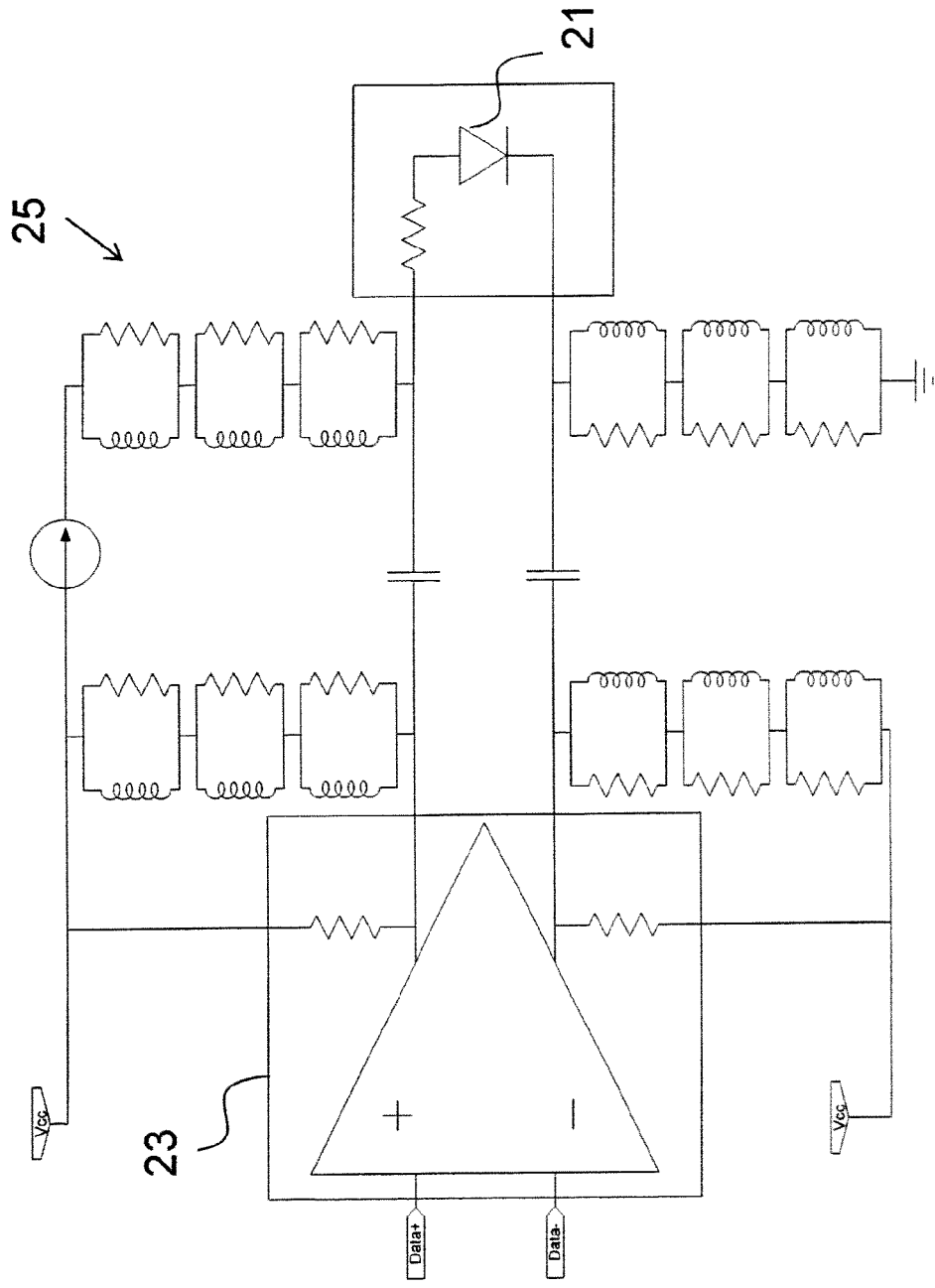
FIG. 2 is a semi-schematic of a laser and drive circuitry.
Figure 11:
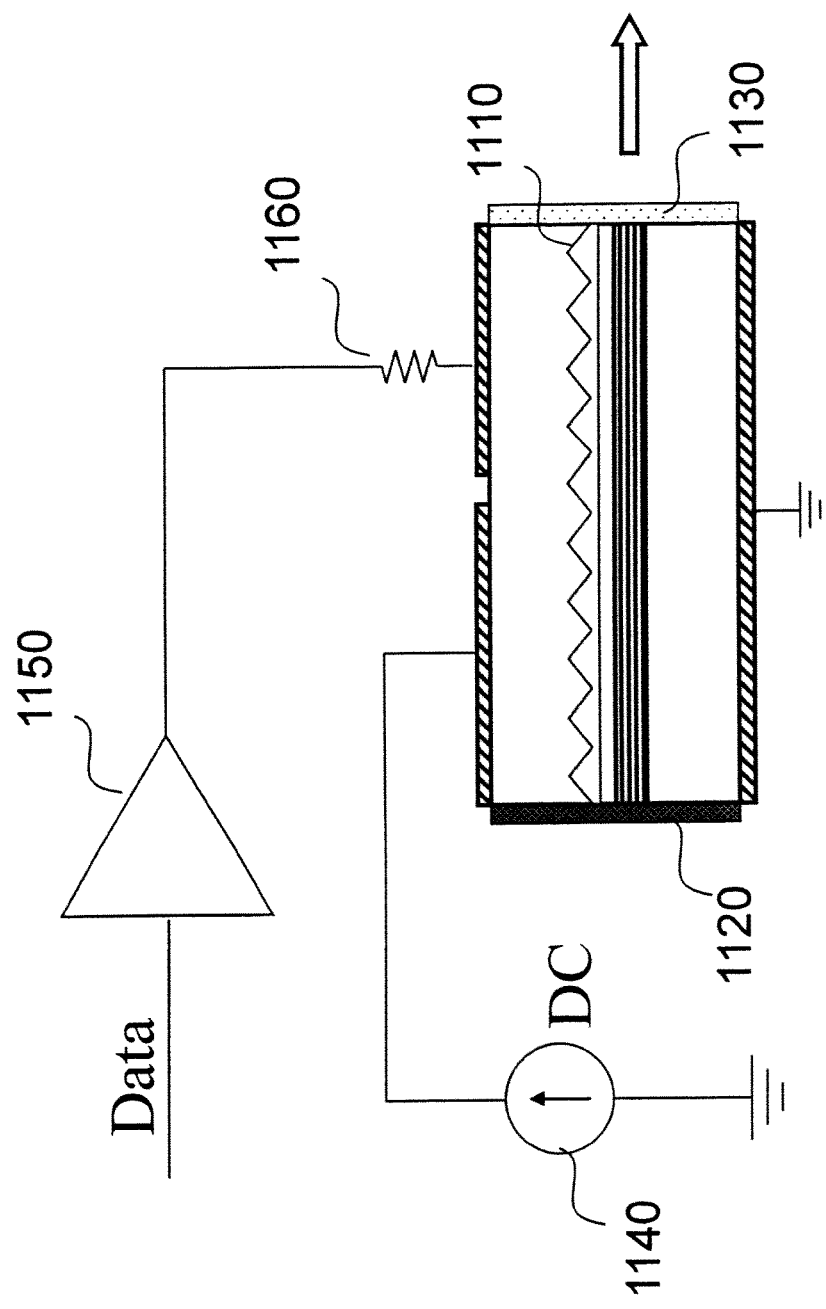
FIG. 11 is a semi-schematic and semi-cross section illustration of a laser and drive circuitry in accordance with aspects of the invention.

FIG. 11 shows a similar laser to that in FIG. 7, with modified electrical drive circuitry that reduces complexity, electrical power dissipation, and cost. In the embodiment of FIG. 11, a grating 1110 of the laser is uniform, a rear facet has a high reflectivity coating 1120 and a front facet has a low reflectivity coating 1130. DC current is applied to the rear section of the laser at a current level sufficient to cause the rear section to laser. For a 0 bit no current is applied to the front section, such that the optical power emitted by the rear section is partially absorbed by the front section, and a low level of optical power ($P_0$ in FIG. 1) is emitted out of the front facet. For a 1 bit a nonzero current is applied to the front section of the laser. This changes the overall lasing condition of the device as the laser effectively becomes longer, lowering the lasing threshold condition and increasing the generation of light in the front section. The power emitted out of the front facet of the laser is now significantly larger ($P_1$ in FIG. 1). As the laser was already lasing, and lasing power was present in the front section, there is no signal degradation associated with turning on the front section. This turn on degradation is caused by the need of optical power to be initially generated by spontaneous emission, which is a slow and random process. In this embodiment the optical power present in the front section substantially eliminates the need for optical power to be generated by spontaneous emission. As both sections are electrically isolated, there is no need to use bias tees. The rear section is directly connected to a DC current source 1140, and the front section is directly connected to a laser driver 1150 that provides a modulated current between zero and a nonzero value through an RF matching resistor 1160.

Figure 12:
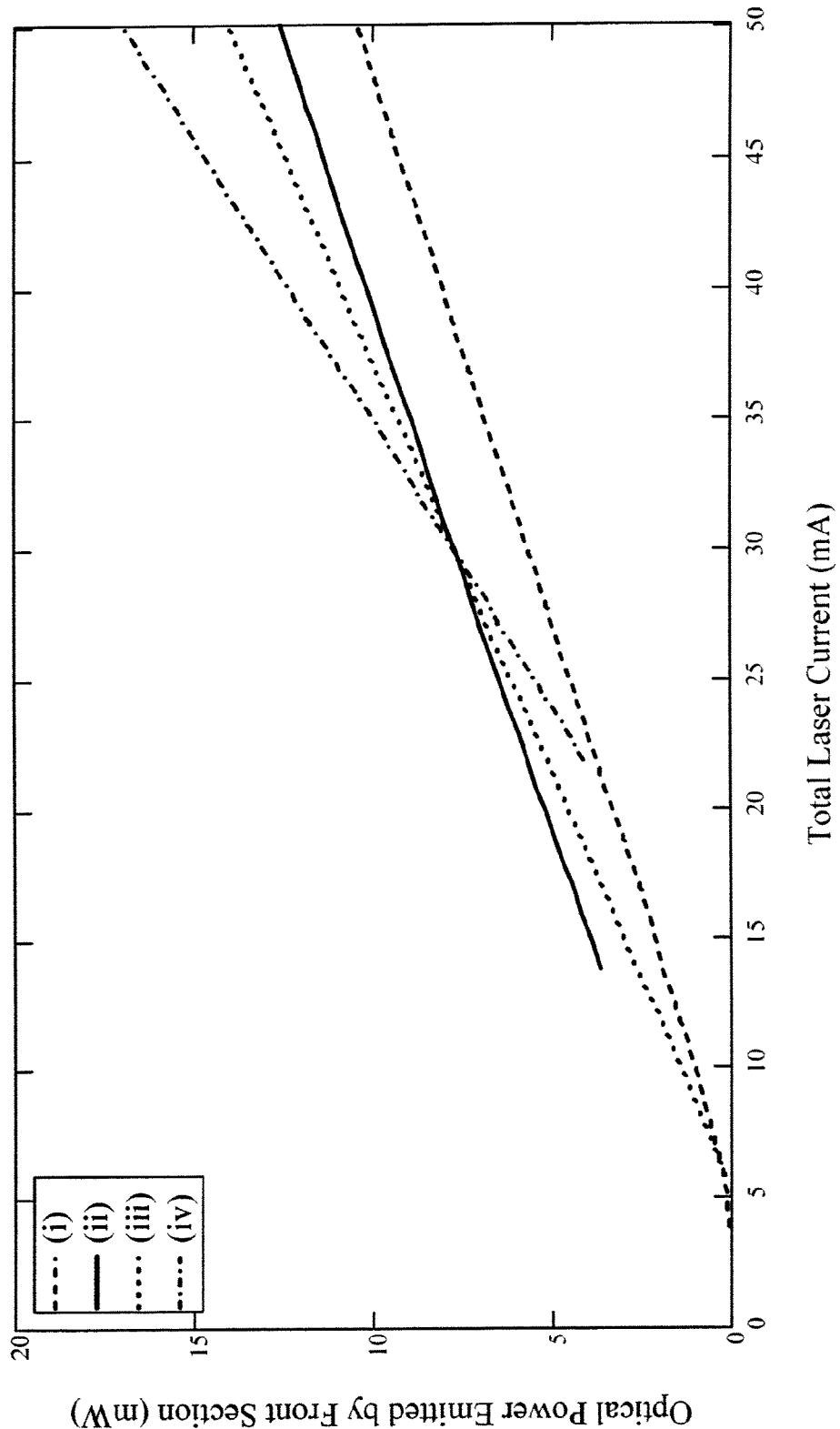
FIG. 12 is a chart of optical power versus laser current.

To illustrate this aspect of the invention, simulations have been performed based on a well-known rate equation model of semiconductor lasers. The typical single section rate equations have been expanded to two sections with an electron density and current injection for each section, as well as an optical power for each section and coupling of the optical powers between the two sections. A laser with a rear section of 0.1 mm length and a front section of 0.05 mm has been assumed. Simulated front facet optical power versus total DC current in the laser (rear+front current) is shown in FIG. 12 for four different cases of driving the laser. In case (i) the current in the front section is fixed to zero while the current in the rear section is varied. In case (ii) the current in the front section is fixed to 10 mA while the current in the rear section is varied. In case (iii) the current in both sections are varied together proportionally as if both sections were combined as one, and in case (iv) the current in the rear section is fixed to 20 mA while the current in the front section is varied. Comparison between case (i) and case (ii) illustrates that a 10 mA increase in current in the front section can more than double the optical power emitted by the front facet. Comparison between case (iii) and case (iv) illustrates that fixing the current in the rear section and modulating the current in the front facet can result in higher slope efficiency out of the front facet, compared to the single section laser. Hence to achieve the required optical modulation amplitude out of the laser, less modulation current is needed and less electrical power is dissipated.

Figure 13:
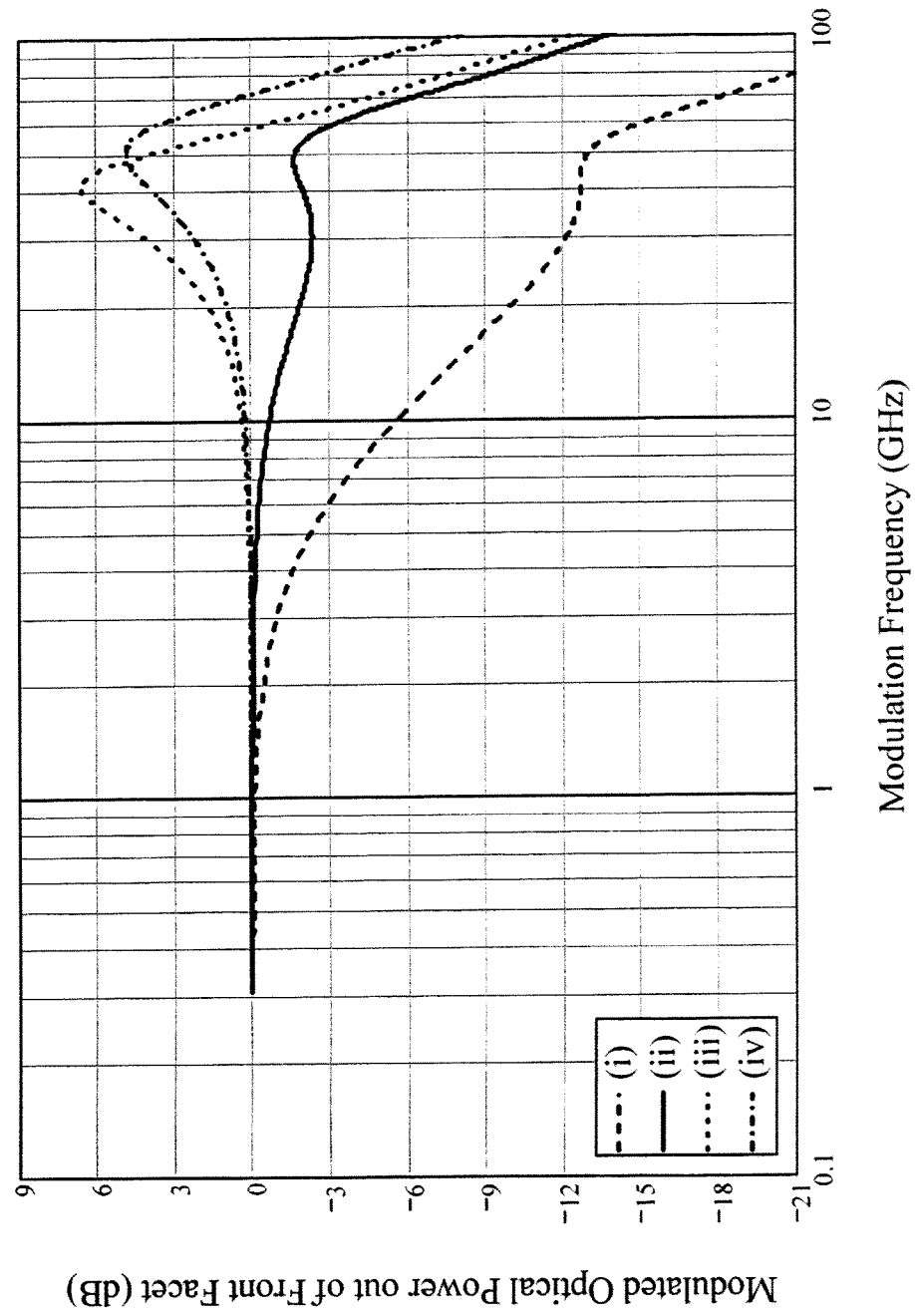
FIG. 13 is a chart of modulated optical power versus modulation frequency.
Figure 14:
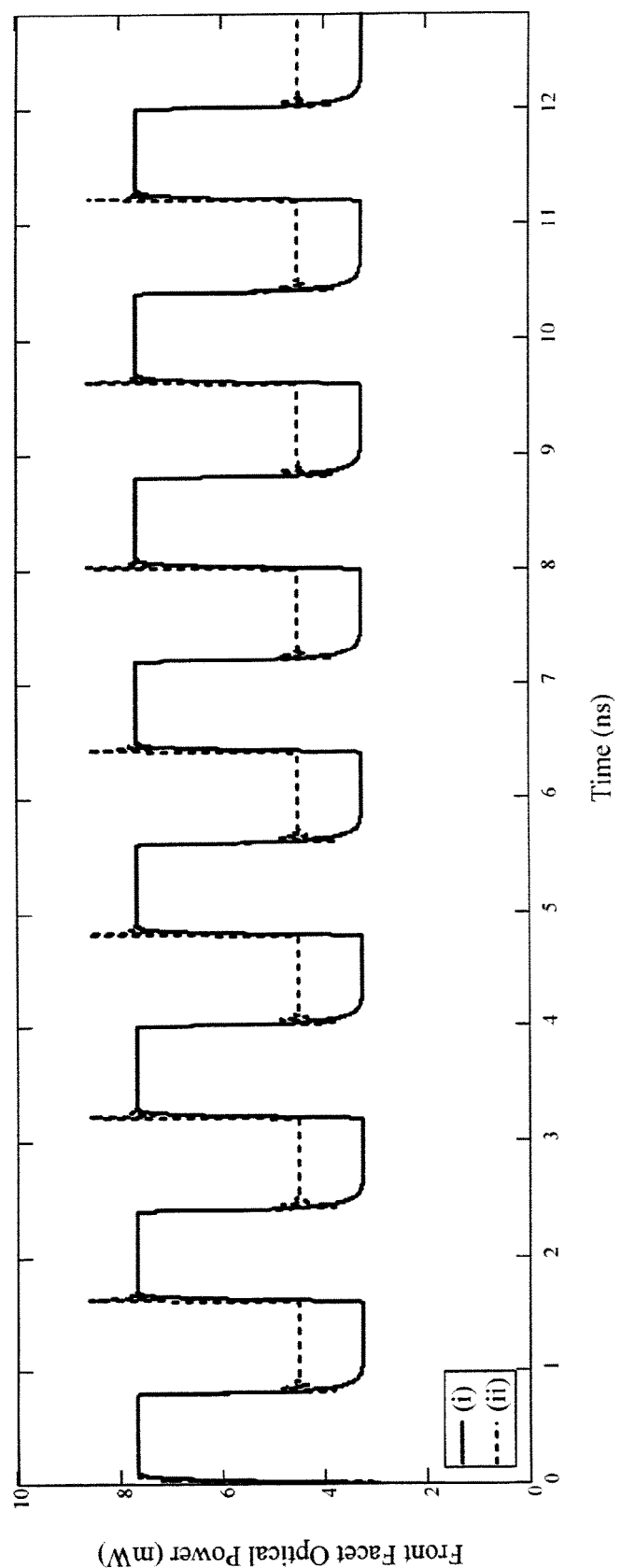
FIG. 14 is a chart of optical power versus time.

To determine if this two-section laser has large enough modulation bandwidth despite having the front section modulated from zero current, the rate equation model was solved under modulation for the particular case where the rear section is biased with a DC current of 20 mA. From FIG. 12 it is seen that with a rear section at 20 mA DC current, a change in current in the front section from 0 to 10 mA will more than double the front facet optical power. The simulated small signal frequency modulation response is shown in FIG. 13 for four different cases. For case (i) the current in the rear section is fixed at 20 mA, and the front section is modulated around an average current of zero, while for case (ii) the rear section current is fixed at 20 mA while the front section is modulated around an average current of 10 mA. Cases (iii) and (iv) correspond to the equivalent modulation of the single section device, with case (iii) at an combined average current of 20 mA and case (iv) an combined average current of 30 mA. Cases (i) and (ii) illustrate that the modulation bandwidth is high enough for 10 Gb/s. The rate equation model was used to simulate a large signal step response with the results shown in FIG. 14 for 2 cases. In case (i) the rear section current is fixed at 20 mA and the front section is modulated from 0 mA to 10 mA with a square wave with a period of 1.6 ns. This period of 1.6 ns corresponds to 8 consecutive 1 bits followed by 8 consecutive 0 bits at 10 Gb/s. Case (ii) shows the results for the equivalent single section laser modulated from 20 mA to 30 mA with the same square wave. Case (i) shows that the two-section laser is fast enough for 10 Gb/s as there is no significant impairment from rise and fall time, and as there is no turn on delay that could be associated with modulating the front section from 0 mA. Comparing case (i) with case (ii) also confirms that a larger modulated power amplitude is achieved with the two-section device for the same total current modulation.

A second embodiment is to replace the 2-section DFB laser with a 2-section Fabry-Perot (FP) laser or distributed Bragg reflector (DBR) laser. In this embodiment the front facet or distributed reflector contributes to lasing of the rear section. Therefore the DC current to the rear section needs to be high enough such that the optical power emitted by the rear section is high enough to bleach through the front section as to provide enough reflected optical power from the front facet or front distributed reflector. In some embodiments the DBR laser may have a long waveguide including a short active region, for example with lengths of 600 microns and 100 microns, respectively.

Figure 15:
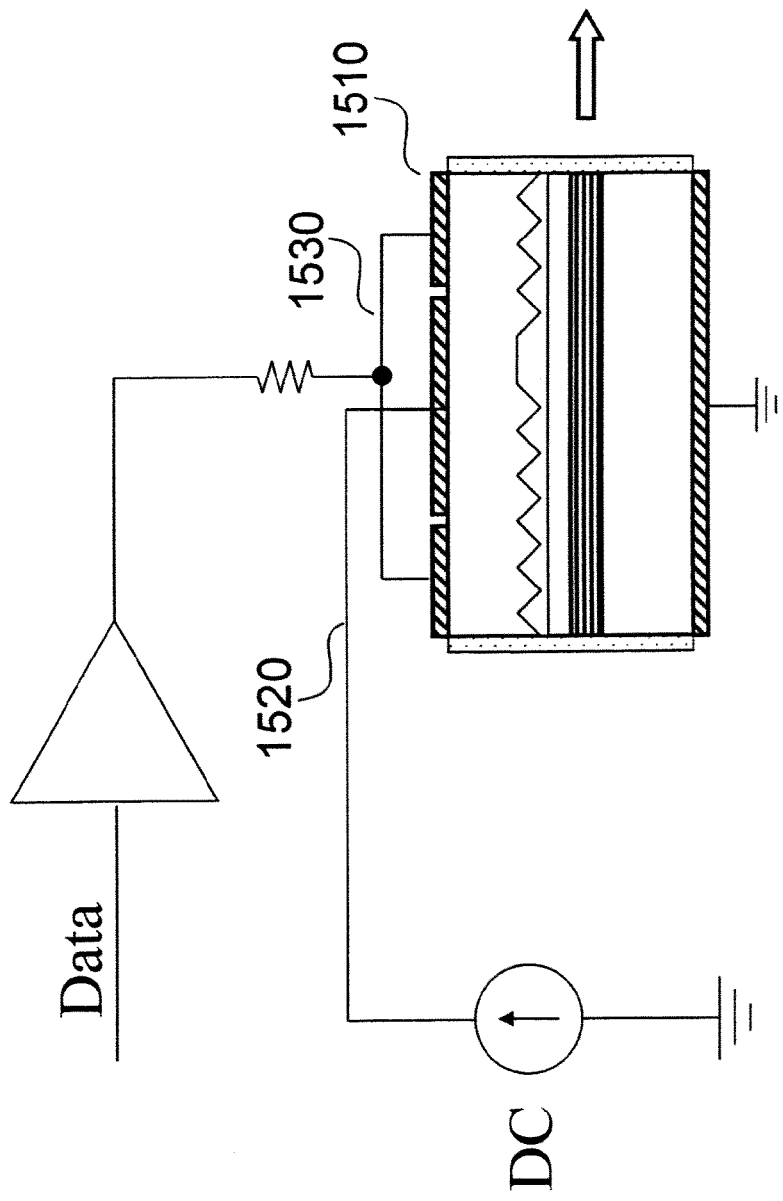
FIG. 15 is a semi-schematic and semi-cross section illustration of a laser and drive circuitry in accordance with aspects of the invention.

A third embodiment uses a three-section phase-shifted DFB laser with symmetric modulation, for example, as illustrated in FIG. 15. To maintain the single mode selectivity of the phase shifted DFB, the device has anti-reflection coatings on both facets, and is separated into three sections, two outer sections 1510 and 1520 and a middle section 1530. A current to the middle section is fixed above its lasing threshold. The two outer sections and facets are generally not essential in achieving lasing. The two outer sections are modulated in parallel from zero current to a modulation current that is split equally between the two outer sections. As the sections are electrically isolated and the modulated sections generally do not need a DC pre-bias current, there is no need for bias tees and the number of passive components in the circuit connecting the laser diode driver and the laser diode is significantly reduced.

A drawback of the third embodiment is that due to symmetry the power emitted by each facet is equal, while typically only the power out of one facet is collected and coupled to a fiber. Hence this is not a very efficient way of generating a optically modulated signal. This drawback can be addressed in a fourth embodiment, which is a variation of the third embodiment where the outer sections are not symmetric, and the modulation current is not split evenly between the two outer sections as to increase the modulated power out of one of the facets and improving the modulation efficiency of the laser.

Figure 16:
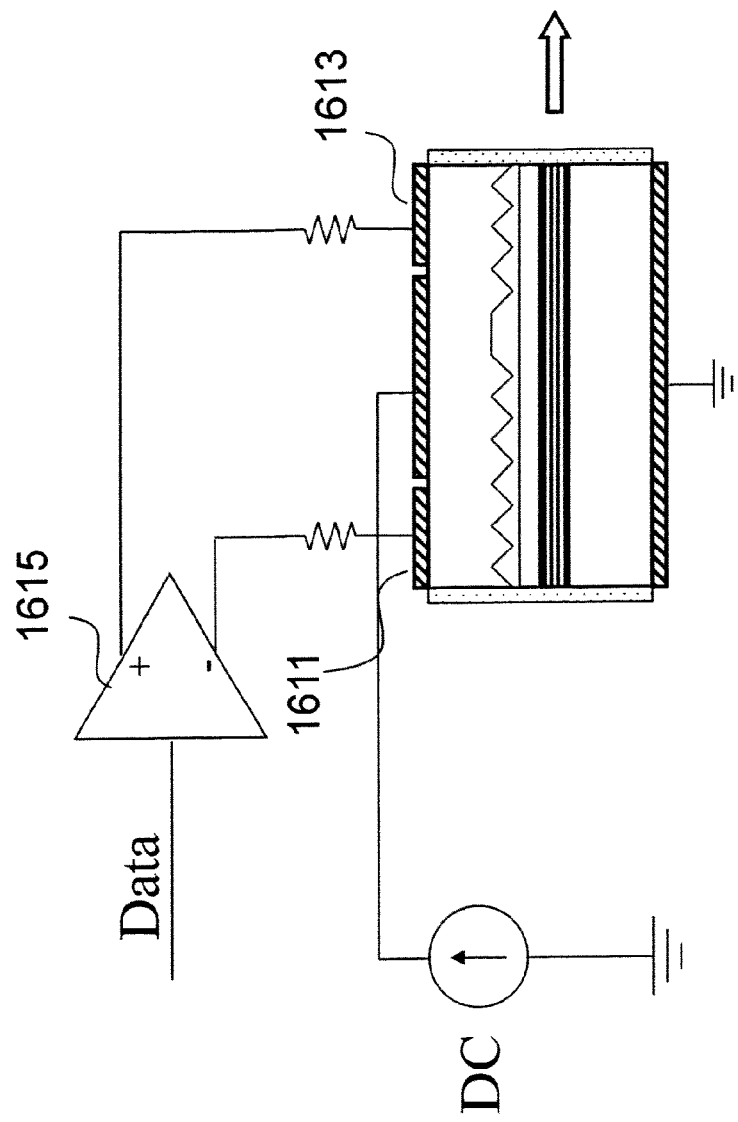
FIG. 16 is a semi-schematic and semi-cross section illustration of a laser and drive circuitry in accordance with aspects of the invention.

A drawback of the embodiments one, three and four discussed immediately above, is the wavelength chirp that can result from using multi-section lasers in this manner. While the laser wavelength chirp generated in embodiments one, three and four is acceptable for relatively short link distances, for longer distances the laser wavelength chirp and associated fiber dispersion can result in significant link performance degradation. A fifth embodiment improves the wavelength chirp performance and is a variation on the third embodiment with two outer sections 1611, 1613 modulated in a push-pull configuration by a driver 1615 with differential output as shown in FIG. 16. In this particular embodiment the frequency chirp performance of the laser can be greatly reduced, as the lasing condition does not change with time. The push-pull modulation shifts the laser power from one side of the device to the other side without changing the laser threshold condition. In some embodiments this may be considered to be modulating the outer sections from a zero current, with elimination of bias tees and a large number of passive components in the circuit connecting the laser diode driver to the laser diode.

Figure 17:
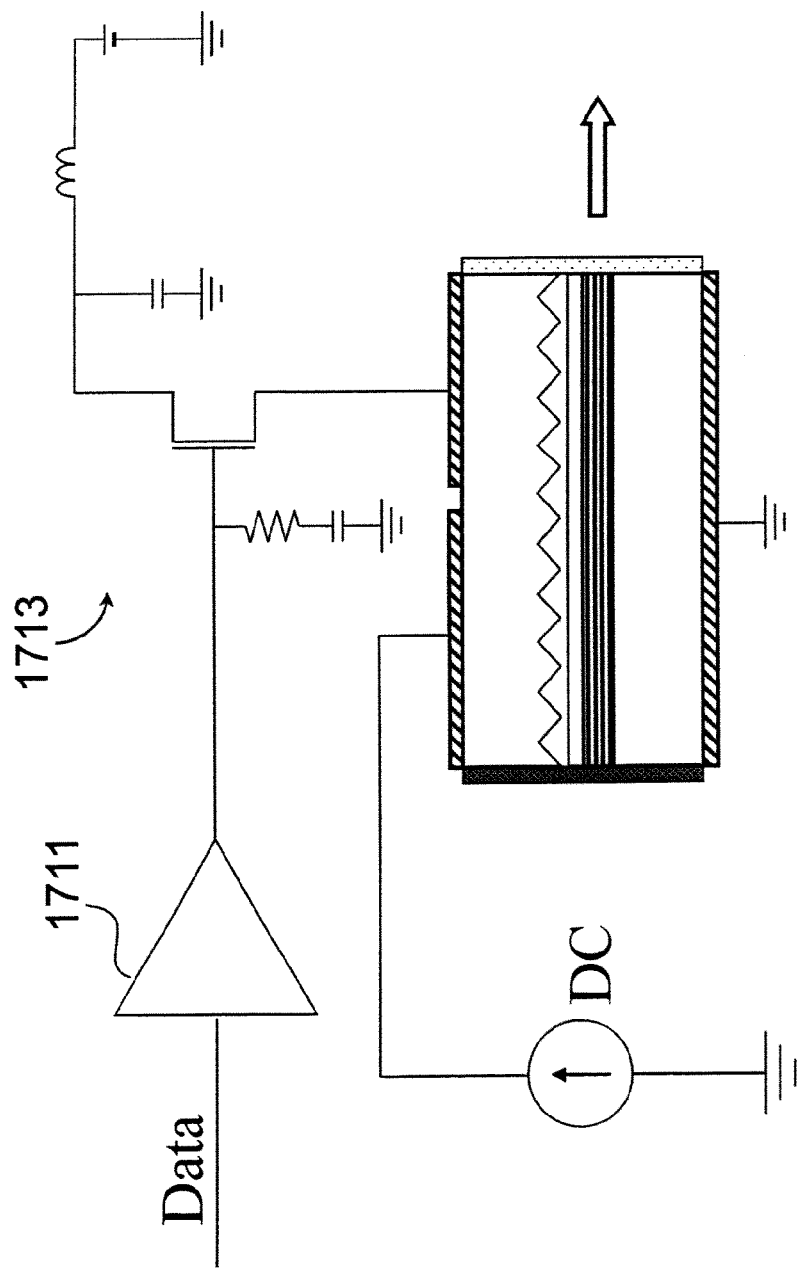
FIG. 17 is a semi-schematic and semi-cross section illustration of a laser and drive circuitry in accordance with aspects of the invention.

A sixth embodiment is a variation on the first embodiment where the laser diode driver is split into an external stage 1711 driving an amplifying stage 1713 inside the laser package as illustrated in FIG. 17. This embodiment results in lower overall electrical power dissipation as the final highest power amplification stage is co-located with the laser and therefore only drives current into the laser chip which has lower impedance than a typically used matched transmission line interface. This particular embodiment does use a few extra passive components collocated with the laser for proper RF performance. By modulating the current in the front section from zero, in some embodiments no bias is needed on the input of the amplifier stage co-located with the laser diode.

Figure 18:
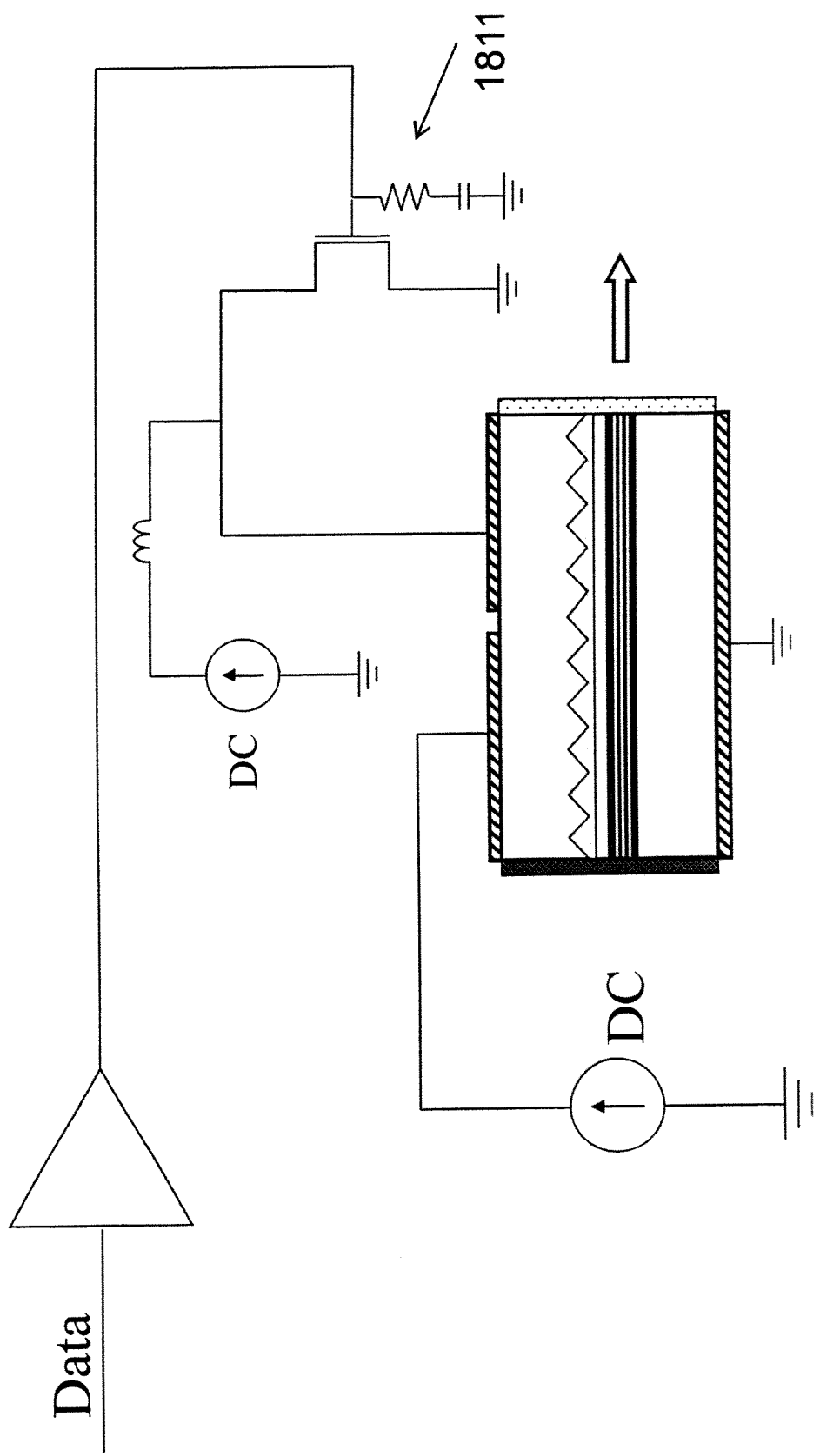
FIG. 18 is a semi-schematic and semi-cross section illustration of a laser and drive circuitry in accordance with aspects of the invention.

A seventh embodiment is a variation on the sixth embodiment where an internal amplifier stage 1811 is connected in parallel with the front laser section, as illustrated in FIG. 18. This embodiment also leads to reduced electrical power dissipation with some additional passive components co-located with the laser. As in the sixth embodiment, in some embodiments no bias is needed on the input of the amplifier stage, however in this case the internal amplifier stage shunts current away from the front section and hence the front section can be modulated from a non zero current for a 0 bit.

Figure 19:
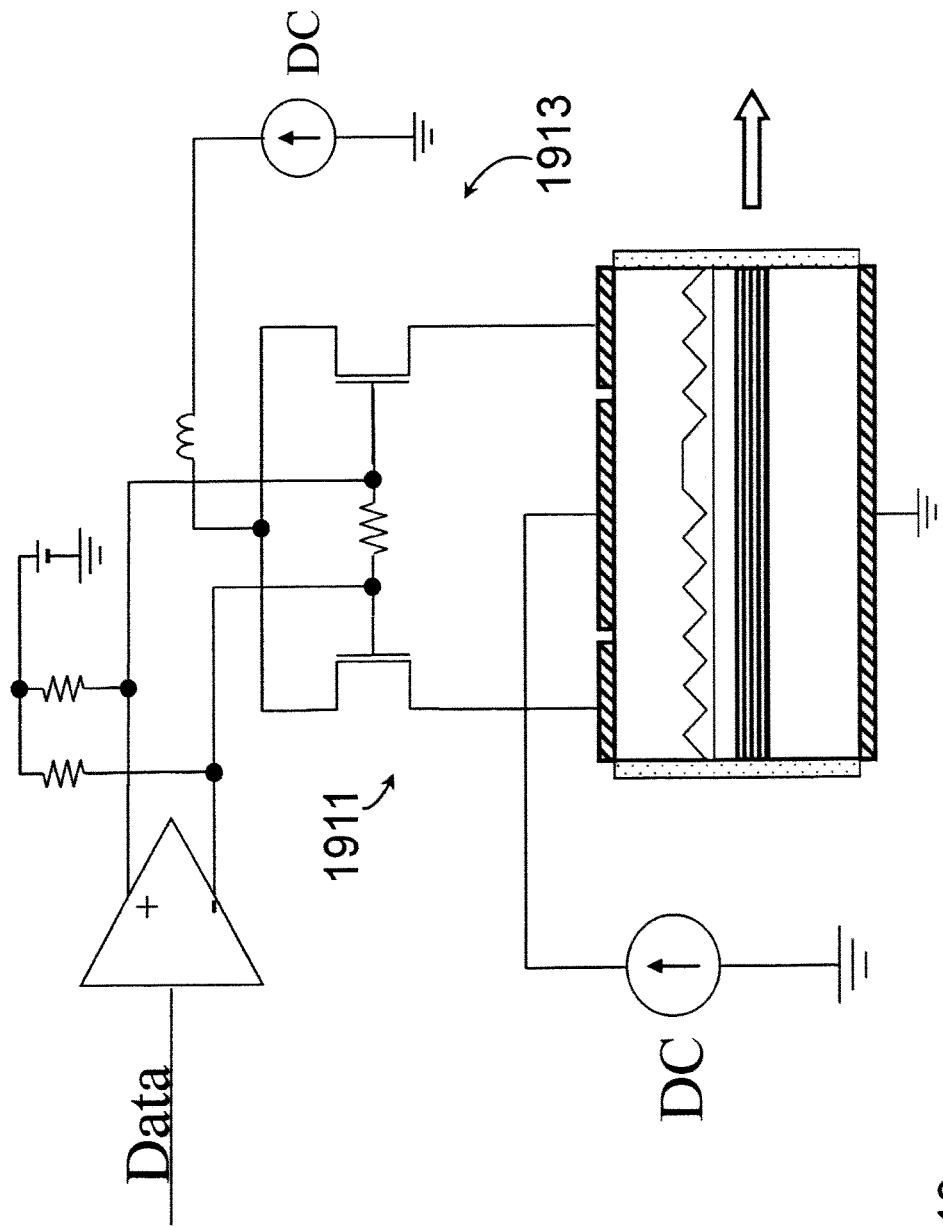
FIG. 19 is a semi-schematic and semi-cross section illustration of a laser and drive circuitry in accordance with aspects of the invention.

An eighth embodiment is a combination of the fifth, sixth and seventh embodiment where the push-pull modulation of the laser is performed through a pair of internal gain stages 1911, 1913 as illustrated in FIG. 19. In this configuration a DC pre-bias can be applied to the inputs of the internal amplification stage without bias tees, as the modulation current uses a differential termination, while the DC pre-bias is in the common mode. Hence FIG. 19 illustrates a differential matched termination with high common mode input impedance. As the internal amplification stages use a voltage DC pre-bias, and not a current DC pre-bias, this DC pre-bias can be applied using high value resistors that do not provide a differential load to the modulation.

A ninth embodiment is a variation on all previous embodiments using a laser driver that provides small adjustable DC pre-bias on the output lines without use of bias tees, allowing for some small pre-bias on the modulated section, which can improve the dynamic performance of the laser in certain cases.

Aspects of the invention therefore include directly modulated lasers in which modulation current is provided to only portions of the laser and methods and circuits for providing modulation current. Although the invention has been discussed with respect to various embodiments, it should be recognized that the invention includes the novel and non-obvious claims supported by this disclosure and the insubstantial variations of same.

The invention claimed is:

1. A distributed feedback (DFB) laser, comprising:
a waveguide including an active region, with a grating in or about the waveguide, the waveguide having a longitudinal length in a direction between a front facet and a rear facet, the grating extending through the longitudinal length of the waveguide, the grating including a phase shift closer to the front facet then the rear facet, and the waveguide being generally about layers forming a p-n junction, and an anode electrical contact and a cathode electrical contact;
with at least one of the anode electrical contact and the cathode electrical contact being closer to the front facet than the rear facet, and having a longitudinal length in the direction between the front facet and the rear facet less than the longitudinal length of the active region.

2. The DFB laser of claim 1, wherein the at least one of the anode electrical contact and the cathode electrical contact having a longitudinal length in the direction between the front facet and the rear facet less than the longitudinal length of the active region is the anode electrical contact.

3. A distributed feedback (DFB) laser, comprising:
a waveguide including a longitudinal active region and a longitudinal non-absorbing region, with a grating in or about the waveguide, the waveguide having a longitudinal length in a direction between a front facet and a rear facet, the grating extending through the longitudinal length of the waveguide and including a phase shift closer to the front facet then the rear facet, and the waveguide being generally about layers forming a p-n junction, and an anode electrical contact and a cathode electrical contact;
with at least one of the anode electrical contact and the cathode electrical contact being closer to the front facet than the rear facet, and having a longitudinal length in the direction between the front facet and the rear facet approximately the longitudinal length of the active region.

* * * * *